United States Patent
Bartoli et al.

(10) Patent No.: US 6,401,164 B1
(45) Date of Patent: Jun. 4, 2002

(54) SECTORED SEMICONDUCTOR MEMORY DEVICE WITH CONFIGURABLE MEMORY SECTOR ADDRESSES

(75) Inventors: Simone Bartoli, Cambiago; Vincenzo Dima, Monza; Mauro Luigi Sali, S. Angelo Lodigiano, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/159,322

(22) Filed: Sep. 23, 1998

(30) Foreign Application Priority Data

Sep. 24, 1997 (EP) ............................................. 97830467

(51) Int. Cl.$^7$ ............................................. G06F 12/06
(52) U.S. Cl. ............................. 711/103; 711/2; 711/166
(58) Field of Search .................................. 711/103, 166, 711/2; 710/38

(56) References Cited

U.S. PATENT DOCUMENTS

| | | | |
|---|---|---|---|
| 4,446,534 A | | 5/1984 | Smith ........................... 365/96 |
| 5,261,068 A | | 11/1993 | Gaskins et al. ............. 395/425 |
| 5,522,076 A | * | 5/1996 | Dewa et al. ................... 713/2 |
| 5,568,641 A | * | 10/1996 | Nelson et al. ................. 713/2 |
| 5,627,784 A | | 5/1997 | Roohparvar ........... 365/189.91 |
| 6,009,495 A | * | 12/1999 | DeRoo et al. .............. 711/103 |

FOREIGN PATENT DOCUMENTS

| | | |
|---|---|---|
| DE | 38 11 151 A1 | 12/1988 |
| EP | 0 536 793 A2 | 4/1993 |
| EP | 0 592 069 A1 | 4/1994 |
| WO | WO 96/38845 | 12/1996 |

OTHER PUBLICATIONS

Motorola, MC68HC11FTS Data Sheet, Jan. 1, 1997, pp. 1–68.*
Motorola, MC68HC11FTS Data Sheet, Jan. 1, 1997, pp. 1, 18, and 24.*
Jerry Jex, Flash Memory BIOS for PC and Notebook Computers, 1991, pp. 692–695.*
Dipert, Brian and Verner, Don, "Designing An Updatable DIOS using Flash Memory," *Microprocessors and Microsystems*, vol. 16, No. 8, pp. 427–446, 1992.

* cited by examiner

Primary Examiner—Matthew Kim
Assistant Examiner—Brian R. Peugh
(74) Attorney, Agent, or Firm—Lisa K. Jorgenson; Robert Iannucci; Seed IP Law Group, PLLC

(57) ABSTRACT

A memory device comprises a plurality of independent memory sectors, external address signal inputs for receiving external address signals that address individual memory locations of the memory device, the external address signals including external memory sector address signals allowing for individually addressing each memory sector, and a memory sector selection circuit for selecting one of the plurality of memory sectors according to a value of the external memory sector address signals. A first and a second alternative internal memory sector address signal paths are provided for supplying the external memory sector address signals to the memory sector selection circuit, the first path providing no logic inversion and the second path providing logic inversion. A programmable circuit activates either one or the other of the first and second internal memory sector address signal paths, so that a position of each memory sector in a space of values (00000h–3FFFFh) of the external address signals can be changed by activating either one or the other of the first and second internal memory sector address signal paths.

15 Claims, 3 Drawing Sheets

TOP BOOT SECTOR

| Memory Sectors | Address Range | A17 | A16 | A15 | A14 | A13 | A12 |
|---|---|---|---|---|---|---|---|
| 32 Kword | 00000h-07FFFh | 0 | 0 | 0 | X | X | X |
| 32 Kword | 08000h-0FFFFh | 0 | 0 | 1 | X | X | X |
| 32 Kword | 10000h-17FFFh | 0 | 1 | 0 | X | X | X |
| 32 Kword | 18000h-1FFFFh | 0 | 1 | 1 | X | X | X |
| 32 Kword | 20000h-27FFFh | 1 | 0 | 0 | X | X | X |
| 32 Kword | 1C000h-2FFFFh | 1 | 0 | 1 | X | X | X |
| 32 Kword | 30000h-37FFFh | 1 | 1 | 0 | X | X | X |
| 16 Kword | 38000h-3BFFFh | 1 | 1 | 1 | 0 | X | X |
| 4 Kword | 3C000h-3CFFFh | 1 | 1 | 1 | 1 | 0 | 0 |
| 4 Kword | 3D000h-3DFFFh | 1 | 1 | 1 | 1 | 0 | 1 |
| 8 Kword | 3E000h-3FFFFh | 1 | 1 | 1 | 1 | 1 | X |

BOOT SECT. { (last three rows)

Fig. 1A

BOTTOM BOOT SECTOR

| Memory Sectors | Address Range | A17 | A16 | A15 | A14 | A13 | A12 |
|---|---|---|---|---|---|---|---|
| 8 Kword | 00000h-01FFFh | 0 | 0 | 0 | 0 | 0 | X |
| 4 Kword | 02000h-02FFFh | 0 | 0 | 0 | 0 | 1 | 0 |
| 4 Kword | 03000h-03FFFh | 0 | 0 | 0 | 0 | 1 | 1 |
| 16 Kword | 04000h-07FFFh | 0 | 0 | 0 | 1 | X | X |
| 32 Kword | 08000h-0FFFFh | 0 | 0 | 1 | X | X | X |
| 32 Kword | 10000h-17FFFh | 0 | 1 | 0 | X | X | X |
| 32 Kword | 18000h-1FFFFh | 0 | 1 | 1 | X | X | X |
| 32 Kword | 20000h-27FFFh | 1 | 0 | 0 | X | X | X |
| 32 Kword | 28000h-2FFFFh | 1 | 0 | 1 | X | X | X |
| 32 Kword | 30000h-37FFFh | 1 | 1 | 0 | X | X | X |
| 32 Kword | 38000h-3FFFFh | 1 | 1 | 1 | X | X | X |

BOOT SECT. { (first four rows)

Fig. 1B

| Memory Sectors | Sect. Sel. Sign. | BAD17 | BAD16 | BAD15 | BAD14 | BAD13 | BAD12 |
|---|---|---|---|---|---|---|---|
| 32 Kword | SS1 | 0 | 0 | 0 | X | X | X |
| 32 Kword | SS2 | 0 | 0 | 1 | X | X | X |
| 32 Kword | SS3 | 0 | 1 | 0 | X | X | X |
| 32 Kword | SS4 | 0 | 1 | 1 | X | X | X |
| 32 Kword | SS5 | 1 | 0 | 0 | X | X | X |
| 32 Kword | SS6 | 1 | 0 | 1 | X | X | X |
| 32 Kword | SS7 | 1 | 1 | 0 | X | X | X |
| 16 Kword | SS8 | 1 | 1 | 1 | 0 | X | X |
| 4 Kword | SS9 | 1 | 1 | 1 | 1 | 0 | 0 |
| 4 Kword | SS10 | 1 | 1 | 1 | 1 | 0 | 1 |
| 8 Kword | SS11 | 1 | 1 | 1 | 1 | 1 | X |

BOOT SECT. { SS9, SS10, SS11 }

SECTORED SEMICONDUCTOR MEMORY DEVICE WITH CONFIGURABLE MEMORY SECTOR ADDRESSES

TECHNICAL FIELD

The present invention relates to a sectored semiconductor memory device with configurable memory sector addresses. Particularly, the invention relates to an electrically erasable and programmable non-volatile memory device, e.g., a Flash EEPROM, comprising individually erasable memory sectors and having configurable memory sector addresses.

BACKGROUND OF THE INVENTION

Flash EEPROMs are non-volatile memory devices which can be programmed and erased electrically. Programming is a selective operation that can involve a single memory location (memory byte or word). On the contrary, erasing is a so-called "bulk" operation, affecting all the memory locations at a time.

Sectored Flash EEPROMs are commercially available which comprise individually erasable memory sectors. In this way, a higher flexibility is achieved because each memory sector can be erased independently from the other memory sectors, so that it is possible not to erase the whole memory locations at a time.

For some particular applications, it is preferable to have memory sectors of different size. By way of example, 4 Megabits (Mbits) word-organized Flash EEPROMs are commercially available wherein the memory space is divided in seven memory sectors of 32 Kilowords (Kwords), one memory sector of 16 Kwords, one memory sector of 8 Kwords and two memory sectors of 4 Kwords. The seven memory sectors of 32 Kwords can for example be used for storing the larger part of a microprocessor code. The memory sector of 16 Kwords, the memory sector of 8 Kwords and the two memory sectors of 4 Kwords form altogether the so-called "boot sector" of 32 Kwords, suitable for example for storing the start-up part code that is rarely subjected to modifications.

It is known that the market demands Flash EEPROMs with both top boot sector configuration and bottom boot sector configuration. In the former, the memory locations of the boot sector correspond to the highest addresses of the memory address space, while in the latter the memory locations of the boot sector correspond to the lowest addresses of the memory address space.

FIGS. 1A and 1B respectively illustrate the differences between the top and bottom boot sector configurations in the above-mentioned example of a 4 Mbits word-organized Flash EEPROM. Such a memory has a size of 256 Kwords, and 18 address signals allow for individually addressing each memory location. Address signals A12–A17, that are a subset of the set of external address signals supplied to the memory device, are used for selecting one of the 11 memory sectors; an "X" in the tables of FIGS. 1A and 1B conventionally means a "don't care" logic state.

Referring to FIG. 1A, wherein the boot sector is located at the top of the address space, the decoding scheme for address signals A12–A17 is the following: if the three most significant address signals A15–A17 are different from "111", then one of the seven sectors of 32 Kwords is addressed, depending on the particular logic configuration of signals A15–A17; address signals A12–A14, together with the remaining subset of twelve least significant external address signals A0–A11 (not shown in the drawing) are used for selecting a particular memory word among the 32 Kwords of the currently selected memory sector. If A15=A16=A17="1", then the boot sector is selected. To decide which of the four memory sectors of the boot sector is addressed, address signals A12–A14 are used. If A14="0", then the 16 Kwords sector is addressed, and A12, A13, together with A0–A11, are used to select one among the 16 Kwords. If differently A14="1", A13 is considered: if A13="1", then the 8 Kwords memory sector is addressed, and A12, together with A0–A11, is used to select one among the 8 Kwords. Finally, if A13="0", either one or the other of the two 4 Kwords memory sectors is addressed depending on A12 being "1" or "0"; A0–A11 are used to select one among the 4 Kwords of the selected sector.

The situation in the case of a memory device with a boot sector located at the bottom of the address space, shown in FIG. 1B, is completely similar, the only difference being that the values of the address signals A12–A17 are the logic complements of those in FIG. 1A.

Up to now, the request of providing Flash EEPROMs with either a top or a bottom boot sector configuration has imposed the necessity of producing two different kinds of devices, differing in some of the photolithographic masks used in the manufacturing process (e.g., the mask for defining the metal interconnections). This obviously increases the production costs, because two manufacturing lines are necessary, and also the testing scheme of the two kinds of devices is different.

SUMMARY OF THE INVENTION

In view of the state of the art described, it is an object of embodiments of the present invention to provide a sectored memory device with configurable memory sector addresses, thus overcoming the drawback of having to produce and test different devices.

According to aspects of the present invention, such object is achieved by a memory device comprising a plurality of independent memory sectors, external address signal inputs for receiving external address signals for addressing individual memory locations of the memory device, the external address signals comprising external memory sector address signals allowing for individually addressing of each memory sector, and a memory sector selection circuit for selecting one of the plurality of memory sectors according to a value of the external memory sector address signals. The memory device also includes a first and a second alternative internal memory sector address signal paths for supplying the external memory sector address signals to the memory sector selection circuit, the first path providing no logic inversion and the second path providing logic inversion and a programmable circuit for activating either one or the other of the first and second internal memory sector address signal paths so that a position of each memory sector in a space of values of the external address signals can be changed by activating either one or the other of the first and second internal memory sector address signal paths.

Thanks to the aspects of present invention, only one device can be produced and tested, and the production costs are therefore reduced. The top or bottom configuration of the memory device can be set at the end of the testing of the memory device, by simply programming the programmable means (e.g., a fuse or a non-volatile memory cell).

BRIEF DESCRIPTION OF THE DRAWINGS

The features and advantages of the present invention will be made apparent by the following detailed description of a practical embodiment thereof, which is illustrated by way of non limiting example in the annexed drawings.

FIG. 1A is a table showing the correspondence between external address signals and memory sectors of a sectored memory device with a top boot sector configuration.

FIG. 1B is similar to FIG. 1A, but refers to a sectored memory device with a bottom boot sector configuration.

DETAILED DESCRIPTION OF THE INVENTION

Figure 2:
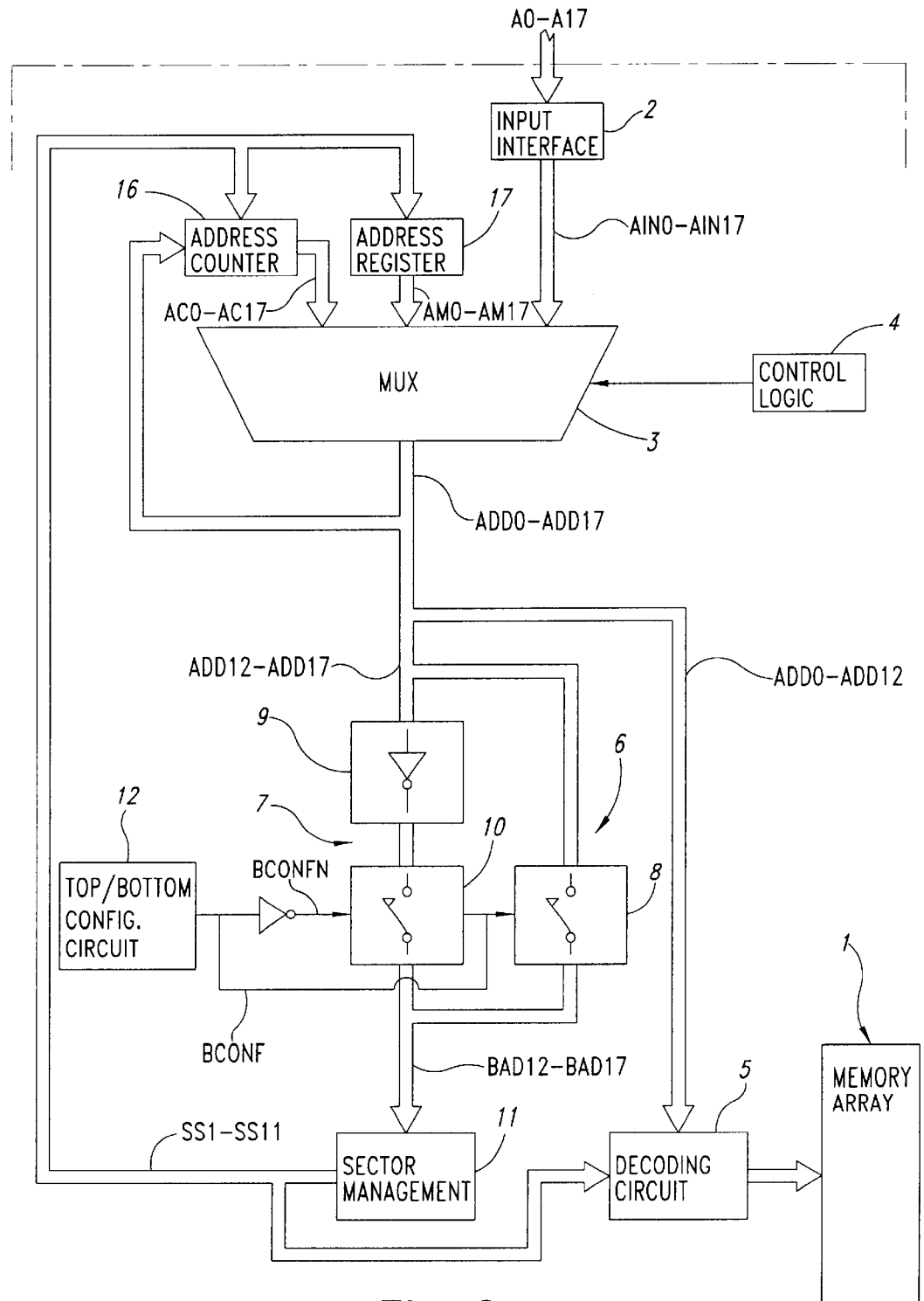
FIG. 2 is a schematic diagram of a sectored memory device according to one embodiment of the present invention.

With reference to FIG. 2, schematically shown therein are the main circuit blocks of a sectored memory device according to an embodiment of the present invention. The memory device is for example a 4 Mbits, word-organized Flash EEPROM comprising a memory array 1 of 256 Kwords divided in the eleven individually erasable memory sectors shown in FIGS. 1A and 1B (e.g., seven memory sectors of 32 Kwords, and a boot sector comprising a memory sector of 16 Kwords, two memory sectors of 4 Kwords and a memory sector of 8 Kwords). With A0–A17 there are indicated eighteen external address signals which are supplied to the memory device by the electronic system in which the memory device is embedded in order to select one among the 256 Kwords. External address signals A0–A17 conventionally supply an input interface circuitry, schematically represented by a block 2, comprising conventional input buffers for regenerating the voltage levels of the external address signals A0–A17. The eighteen output signals AIN0–AIN17 of the input interface circuitry 2 are supplied to a conventional multiplexer 3, controlled by a conventional control logic 4 of the memory device. The output of the multiplexer 3 forms a set of eighteen internal address signals ADD0–ADD17 of the memory device.

A subset ADD0–ADD11 of the set of internal address signals that corresponds to the external address signals A0–A11, supplies a conventional decoding circuitry 5 comprising row and column decoder circuits. Another subset ADD12–ADD17 of the set of internal address signals, corresponding to the external address signals A12–A17 that, as explained in connection with FIGS. 1A and 1B, are used for selecting one among the eleven memory sectors of the memory device, is supplied to a first path 6 and a second path 7. In the first path 6, signals ADD12–ADD17 are individually supplied to respective switches, schematically represented by a block 8, controlled by a first control signal BCONF. In the second path 7, signals ADD12–ADD17 are individually supplied to respective inverters, schematically represented by a block 9, and the output of each inverter is supplied to a respective switch, schematically represented by a block 10. The switches of block 10 are controlled by a second control signal BCONFN, that is the logic complement of signal BCONF. Six signal lines BAD12–BAD17 are connected to the outputs of respective switches of blocks 8 and 10, signal lines BAD12–BAD17 supplying a conventional sector management circuitry schematically represented by a block 11. The sector management circuitry 11 comprises a memory sector selection circuit that performs a decoding of the signals BAD12–BAD17 and generates eleven sector selection signals SS1–SS11 which are supplied to the decoding circuitry 5 for selecting one of the eleven memory sectors into which the memory array 1 is divided.

Figures 3, 4:
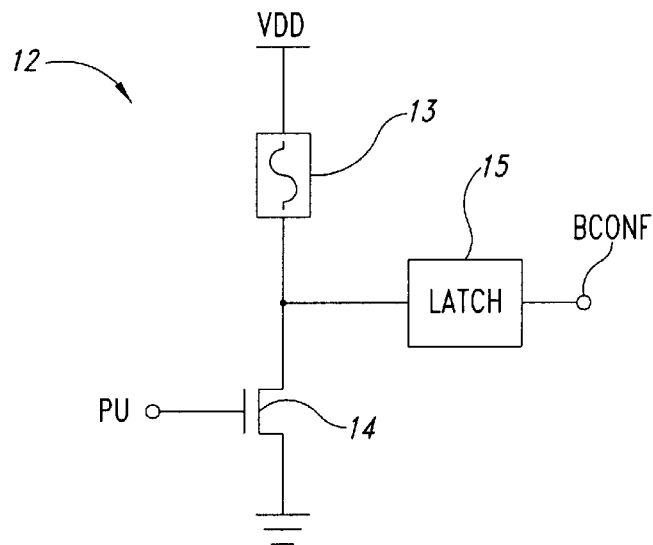
FIG. 3 is a schematic diagram of a configurable element of the memory device shown in FIG. 2.
FIG. 4 is a table showing the correspondence between internal address signals of the memory device of FIG. 2 and memory sectors thereof.

FIG. 4 is a table showing by way of example only a possible internal ecoding scheme implemented by the sector management circuit 11 for the generation of the sector selection signals SS1–SS11 based on the logic configuration of signals BAD12–BAD17. Depending on the logic configuration of signals BAD12–BAD17, the sector management circuit 11 activates only one of the eleven sector selection signals SS1–SS11 at a time.

Signal BCONF is generated by a top/bottom configuration circuit block 12 wherein there is permanently stored the information regarding the position of the boot sector within the external address space, ie., if the boot sector is located at the top of the external address space (address range 38000h to 3FFFFh, as shown in FIG. 1A), or differently the boot sector is located at the bottom of the external address space (address range 00000h to 07FFFh, as shown in FIG. 1B). By way of example only, it can be assumed that when BCONF="1" (and consequently BCONFN="0") the switches of block 8 are closed (conductive) and the switches of block 10 are open (non conductive), while when BCONF="0" (BCONFN="1") the switches of block 8 are open (non conductive) and the switches of block 10 are closed (conductive).

Thus, the following is obtained (assuming by way of example that no logic inversion takes place in the input interface circuit block 2, i.e. that ADD0–ADD17 are equal to A0–A17 from a logic point of view):

| BCONF="1": | BCONF="0": |
|---|---|
| BAD12=ADD12=12 | BAD12=NOT(ADD12)=NOT(A12) |
| BAD13=ADD13=13 | BAD13=NOT(ADD13)=NOT(A13) |
| BAD14=ADD14=14 | BAD14=NOT(ADD14)=NOT(A14) |
| BAD15=ADD15=15 | BAD15=NOT(ADD15)=NOT(A15) |
| BAD16=ADD16=16 | BAD16=NOT(ADD16)=NOT(A16) |
| BAD17=ADD17=17 | BAD17=NOT(ADD17)=NOT(A17) |

A possible practical embodiment of the top/bottom configuration circuit block 12 is shown, by way of example only, in FIG. 3. A non-volatile programmable memory element, such as a simple fuse 13, is connected between a voltage supply VDD of the memory device and the drain of an N-channel MOSFET 14, with a source connected to ground and a gate controlled by a signal PU, generated for example by the control circuit 4. The drain of MOSFET 14 supplies an input of a known latch circuit or flip-flop 15, whose output forms signal BCONF.

Fuse 13 can be selectively blown or not during the device testing phase. At the memory device power-up, signal PU is activated for a short time and MOSFET 14 turned on. If the fuse 13 is not blown, then the input of the latch 15 is at VDD, while if the fuse is blown the input of latch 15 is at ground. The latch 15 sets in either one of two opposite logic states, and so does the output signal BCONF. Once the latch 15 is set, signal PU can be deactivated and MOSFET 14 turned off, to prevent unnecessary current consumption.

It is to be understood that fuse 13 can practically be a non-volatile memory cell, e.g., an EPROM memory cell or a FLOTOX Flash EEPROM cell. In general, the non-volatile programmable memory element 13 and the structure of circuit 12 can be the same as those used to implement redundancy.

Also shown in FIG. 2 are an address counter 16 and an address memory register 17 which are conventionally provided in Flash EEPROMs in order to perform the erasing operation. The address counter 16 is supplied by the internal address signals ADD0–ADD17 and the sector selection signals SS1–SS11, and having eighteen output signals AC0–AC17 supplying the multiplexer 3. The address memory register 17 is supplied by the sector selection signals SS1–SS11, and has eighteen output signals AM0–AM17 supplying the multiplexer 3. During an erase operation, the control logic 4 drives the multiplexer 3 so as to switch from the outputs of the input interface circuitry 2 to the outputs of the address counter 16 and the address memory register 17.

Assuming that the memory device is intended to be used in an electronic system wherein it is necessary that the boot sector is located at the top of the external address space, then during the memory device testing following its manufacturing the configuration circuit block 12 is programmed so that BCONF="1" (e.g., referring to FIG. 3, the fuse 13 is not blown). Thus, when the memory device is operated and addressed, the signals supplying the sector management circuit 11 are: BAD12=A12, BAD13=A13, ... ,BAD17=A17. Considering FIGS. 1A and FIG. 4, it follows that the boot sector is selected when the external address signals A0–A17 take values in the ange 38000h and 3FFFFh, i.e., at the top of the external address space.

Differently, if the memory device is intended to be used in an electronic system wherein it is necessary that the boot sector is located at the bottom of the external address space, during testing circuit block 12 is programmed so that BCONF="0" (the fuse 13 is blown). When the memory device is operated and addressed, the signals supplying the sector management circuit 11 are: BAD12=NOT(A12), BAD13=NOT(A13), ... ,BAD17=NOT(A17). This means that, for example, sector selection signal SS10 is activated, and the corresponding memory sector selected, when A12="0", A13="1", A14=A15=A16=A17="0", i.e., for external addresses values in the range 02000h to 02FFFh, and the memory device behaves as if the boot sector were physically located at the bottom of the external address space (FIG. 1B).

From the foregoing it will be appreciated that,. although specific embodiments of the invention have been described herein for purposes of illustration, various modifications may be made without deviating from the spirit and scope of the invention. Accordingly, the invention is not limited except as by the appended claims.

What is claimed is:

1. A memory device comprising:
  a plurality of independent memory sectors;
  an input interface for receiving external address signals and for converting the external address signals into internal address signals for addressing individual memory locations of the memory device, said internal address signals comprising internal memory sector address signals allowing for individually addressing each memory sector;
  memory sector selection means for selecting one of the plurality of memory sectors according to a value of the internal memory sector address signals;
  first and second internal memory sector address signal paths coupled to the input interface, the first internal memory sector address signal path being structured to receive the internal memory sector address signals and supply first internal sector signals to the memory sector selection means with no logic inversion compared to the internal memory sector address signals, and the second internal memory sector address signal path being structured to receive the internal memory sector address signals and supply to the memory sector selection means second internal sector signals with logic inversion compared to the internal memory sector address signals; and
  programmable means for activating either one or the other of the first and second internal memory sector address signal paths, such that when the first internal memory sector address signal path is activated, the internal memory sector address signals are associated with a first one of the memory sectors, and when the second internal memory sector address signal path is activated, the internal memory sector address signals are associated with a second one of the memory sectors.

2. The memory device of claim 1 wherein said plurality of memory sectors comprises sectors of different sizes.

3. The memory device of claim 2 wherein said plurality of memory sectors comprises a boot sector, a position of the boot sector in the space of values of the external address signals being interchangeable between a top position and a bottom position by activating either one or the other of the first and second internal memory sector address signal paths.

4. The memory device according to claim 1 wherein said programmable means comprises a non-volatile programmable element programmable in either one or another of two opposite states, and a detection circuit means for detecting said either one or the other of the two opposite states and for generating a control signal determining the activation of either one or the other of said two internal memory sector address signal paths.

5. The memory device of claim 4 wherein said first and second internal memory sector address signal paths comprise respective switching means controlled by said control signal for selectively connecting the first or the second internal memory sector address signal paths to the memory sector selection means.

6. The memory device of claim 4 wherein the non-volatile programmable element is connected between a first voltage reference and an internal node and the detection circuit means includes a transistor coupled between the internal node and a second voltage reference and a memory element coupled between the internal node and each of the internal memory sector address signal paths.

7. The memory device according to claim 1 wherein said second internal memory sector address signal path comprises inverter means for providing said logic inversion.

8. A memory device comprising:
  memory cells arranged in a plurality of independent memory sectors;
  a set of address inputs structured to receive external memory address signals used to select one of the plurality of memory sectors;
  a memory selection circuit;
  a first signal path structured to provide the memory selection circuit with the external memory address signals;
  a second signal path structured to provide the memory selection circuit with a modified set of memory address signals;
  a programmable selection circuit structured to decouple one of the signal paths from the memory selection circuit; and
  decoding circuitry having a first input coupled to the address inputs, a second input coupled to an output of the memory selection circuit, and an output coupled to the memory cells, wherein the memory selection circuit is structured to apply to the second input of the decoding circuitry a sector selection signal that depends on whichever one of the signal paths that is not decoupled by the programmable selection circuit, and the decoding circuitry is structured to access the memory cells according to the sector selection signal and according to internal address signals received at the first input from the address inputs.

9. The memory device of claim 8 wherein each bit of the modified set of memory address signals is complementary to each respective bit of the external memory address signals.

10. The memory device of claim 8 wherein the programmable selection circuit comprises a fuse.

11. The memory device of claim 8 wherein the programmable selection circuit comprises a non-volatile memory cell.

12. The memory device of claim 8 wherein the first signal path comprises an inverter circuit.

13. The memory device of claim 8 wherein the programmable selection circuit includes a one-time programmable non-volatile element.

14. The memory device of claim 8 wherein the first and second signal paths include respective first and second switches each having a control terminal coupled to the programmable selection circuit.

15. The memory device of claim 14 wherein the programmable selection circuit includes a programmable non-volatile element connected between a first voltage reference and an internal node, a transistor coupled between the internal node and a second voltage reference, and a memory element coupled between the internal node and each of the control terminals of the first and second switches.

* * * * *